US011768086B2

(12) United States Patent
Jost et al.

(10) Patent No.: US 11,768,086 B2
(45) Date of Patent: Sep. 26, 2023

(54) METHOD FOR FORMING A SENSOR CIRCUIT

(71) Applicant: Infineon Technologies AG, Neubiberg (DE)

(72) Inventors: Franz Jost, Stuttgart (DE); Harald Witschnig, Landskron (AT); Juergen Zimmer, Neubiberg (DE)

(73) Assignee: Infineon Technologies AG, Neubiberg (DE)

(*) Notice: Subject to any disclaimer, the term of this patent is extended or adjusted under 35 U.S.C. 154(b) by 1125 days.

(21) Appl. No.: 16/456,905

(22) Filed: Jun. 28, 2019

(65) Prior Publication Data

US 2019/0316935 A1 Oct. 17, 2019

Related U.S. Application Data

(62) Division of application No. 14/976,348, filed on Dec. 21, 2015, now Pat. No. 10,337,888.

(30) Foreign Application Priority Data

Dec. 23, 2014 (DE) .......................... 102014119531.0

(51) Int. Cl.
*G01D 5/16* (2006.01)
*G01R 33/09* (2006.01)
(Continued)

(52) U.S. Cl.
CPC ................ *G01D 5/16* (2013.01); *G01D 3/08* (2013.01); *G01R 33/0052* (2013.01);
(Continued)

(58) Field of Classification Search
CPC ... G01D 5/16; G01D 3/08; G01D 5/12; G01R 33/0052; G01R 33/09; H01L 27/22;
(Continued)

(56) References Cited

U.S. PATENT DOCUMENTS

| 5,949,051 A | 9/1999 | Kiriyama | |
|---|---|---|---|
| 6,137,287 A * | 10/2000 | Ichihashi | ................ G01D 3/08 |
| | | | 327/4 |

(Continued)

FOREIGN PATENT DOCUMENTS

| CN | 101419227 A | 4/2009 |
|---|---|---|
| CN | 101512370 A | 8/2009 |

(Continued)

OTHER PUBLICATIONS

W. Granig, et al. "Integrated GMR Angle Sensor for Electrical Commutated Motors including Features for Safety Critical Applications"; Procedia Engineering 2010 pp. 1384-01387.

(Continued)

*Primary Examiner* — S M Sohel Imtiaz
(74) *Attorney, Agent, or Firm* — Banner & Witcoff Ltd.

(57) ABSTRACT

A method for forming a sensor circuit. The method includes forming a plurality of magnetoresistive structures having a first predefined reference magnetization direction in a first common area of a common semiconductor substrate; forming a plurality of magnetoresistive structures having a second predefined reference magnetization direction in a second common area of the common semiconductor substrate; and forming electrically conductive structures electrically coupling the magnetoresistive structures having the first predefined reference magnetization direction to the magnetoresistive structures having the second predefined reference magnetization direction to form a plurality of half-bridge sensor circuits, wherein each half-bridge sensor circuit comprises a magnetoresistive structure having the first predefined reference magnetization direction electrically coupled to a second magnetoresistive structure having the second predefined reference magnetization direction.

16 Claims, 7 Drawing Sheets

(51) Int. Cl.
  *G01R 33/00* (2006.01)
  *G01D 3/08* (2006.01)
  *H10B 61/00* (2023.01)
  *H10N 59/00* (2023.01)
  *H10N 50/00* (2023.01)

(52) U.S. Cl.
  CPC ............ *G01R 33/09* (2013.01); *H10B 61/00* (2023.02); *H10N 50/00* (2023.02); *H10N 59/00* (2023.02)

(58) Field of Classification Search
  CPC ........ H01L 43/00; H10B 61/00; H10N 59/00; H10N 50/00
  See application file for complete search history.

(56) References Cited

U.S. PATENT DOCUMENTS

| | | | |
|---|---|---|---|
| 6,392,407 B1 | 5/2002 | Mishiro et al. | |
| 6,501,678 B1 | 12/2002 | Lenssen et al. | |
| 7,112,962 B2 | 9/2006 | Ricks et al. | |
| 7,262,594 B1 | 8/2007 | Tomino | |
| 7,312,609 B2* | 12/2007 | Schmollngruber | B82Y 25/00 |
| | | | 324/252 |
| 9,411,024 B2* | 8/2016 | Raberg | G01R 33/098 |
| 2003/0218458 A1 | 11/2003 | Seger et al. | |
| 2004/0012386 A1 | 1/2004 | Haas et al. | |
| 2004/0075450 A1* | 4/2004 | Buge | G08C 15/00 |
| | | | 324/710 |
| 2006/0012459 A1* | 1/2006 | Lenssen | G01R 33/09 |
| | | | 338/32 R |
| 2006/0077083 A1 | 4/2006 | Kiriyama et al. | |
| 2008/0012558 A1* | 1/2008 | Rossler | G01R 33/07 |
| | | | 324/252 |
| 2010/0030263 A1 | 2/2010 | Cheng et al. | |
| 2012/0136625 A1* | 5/2012 | Joachimsthaler | G01D 5/2457 |
| | | | 702/150 |
| 2013/0335070 A1 | 12/2013 | Abe et al. | |
| 2015/0108972 A1 | 4/2015 | Zimmer et al. | |
| 2015/0241523 A1 | 8/2015 | Scherr | |
| 2015/0354999 A1* | 12/2015 | Ausserlechner | H05K 1/181 |
| | | | 73/866.5 |
| 2015/0377646 A1* | 12/2015 | Meyer | G01R 33/09 |
| | | | 324/207.25 |
| 2016/0169985 A1* | 6/2016 | Weber | G01R 33/0011 |
| | | | 324/252 |

FOREIGN PATENT DOCUMENTS

| | | |
|---|---|---|
| CN | 102288927 A | 12/2011 |
| CN | 102692242 A | 9/2012 |
| CN | 103282745 A | 9/2013 |
| CN | 103376426 A | 10/2013 |
| DE | 10304024 A1 | 8/2003 |
| DE | 102006032277 A1 | 1/2008 |
| DE | 102011055000 A1 | 5/2012 |
| DE | 112011104630 T5 | 10/2013 |
| EP | 1503184 A2 | 2/2005 |
| EP | 2284495 A2 | 2/2011 |
| EP | 2546611 A1 | 1/2013 |
| JP | 2006266999 A | 10/2006 |
| JP | 2010078341 A | 4/2010 |

OTHER PUBLICATIONS

Office action dated Mar. 13, 2017 for German Patent Application No. 102014119531.0.

* cited by examiner

METHOD FOR FORMING A SENSOR CIRCUIT

TECHNICAL FIELD

Embodiments relate to sensors, and in particular to a sensor circuit, a sensor device and a method for forming a sensor circuit.

BACKGROUND

Functional safety represents a clear differentiator for current and future products in the automotive industry, for example. Concepts may be established to achieve corresponding targets in terms of an automotive safety integrity level (ASIL). To achieve a dedicated ASIL level, different target parameters, e.g. Failure-in-time (FIT) rate, diagnostic coverage, single point faults metrics (SPFM), and latent fault metrics (LPFM) may be expected to achieve a dedicated value. Functional safety in position sensors, e.g. angle sensors, may need to be improved, for example.

SUMMARY

Some embodiments relate to a sensor circuit. The sensor circuit includes a plurality of half-bridge sensor circuits. The sensor circuit further includes a sensor output value determination circuit configured to determine a sensor output value based on at least one half-bridge sensor signal provided by one of the half-bridge sensor circuits of the plurality of half-bridge sensor circuits. The sensor circuit further includes an error determination circuit configured to generate an error signal based on a first half-bridge sensor signal generated by a first half-bridge sensor circuit of the plurality of half-bridge sensor circuits and a second half-bridge sensor signal generated by a second half-bridge sensor circuit of the plurality of half-bridge sensor circuits. The sensor circuit further includes a control circuit configured to control, based on the error signal, a selection of one of the first half-bridge sensor circuit and the second half-bridge sensor circuit for providing one of the first half-bridge sensor signal and the second half-bridge sensor signal to the sensor output value determination circuit.

Some embodiments relate to a sensor device. The sensor device includes a plurality of half-bridge sensor circuits, each including a pair of magnetoresistive structures. The sensor device includes a sensor output value determination circuit configured to determine a sensor output value based on at least four half-bridge sensor signals provided by four of the half-bridge sensor circuits of the plurality of half-bridge sensor circuits. A first half-bridge sensor circuit and a second half-bridge sensor circuit of the plurality of half-bridge sensor circuits are formed on a common semiconductor substrate. A magnetoresistive structure of the first half-bridge sensor circuit having a same predefined reference magnetization direction as a magnetoresistive structure of the second half-bridge sensor circuit are formed adjacently on the common semiconductor substrate.

Some embodiments relate to a method for forming a sensor circuit. The method includes forming a plurality of magnetoresistive structures having a first predefined reference magnetization direction in a first common area of a common semiconductor substrate. The method further includes forming a plurality of magnetoresistive structures having a second predefined reference magnetization direction in a second common area of the common semiconductor substrate. The method further includes forming electrically conductive structures electrically coupling the magnetoresistive structures having the first predefined reference magnetization direction to the magnetoresistive structures having the second predefined reference magnetization direction to form a plurality of half-bridge sensor circuits. Each half-bridge sensor circuit includes a magnetoresistive structure having the first predefined reference magnetization direction electrically coupled to a second magnetoresistive structure having the second predefined reference magnetization direction.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
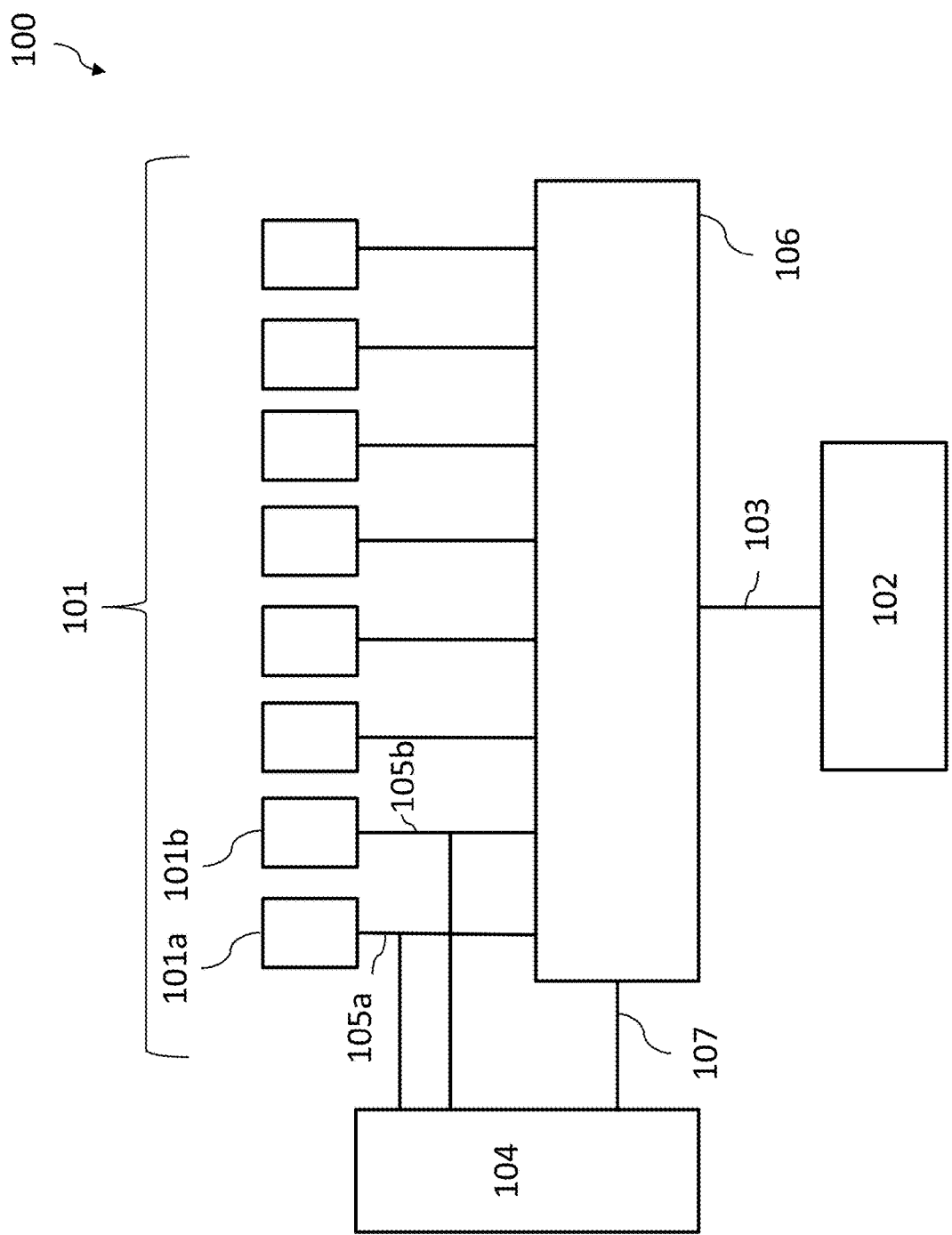
FIG. 1 shows a schematic illustration of a sensor circuit.

FIG. 1 shows a schematic illustration of a sensor circuit 100 according to an embodiment.

The sensor circuit 100 may include a plurality of half-bridge sensor circuits 101. The sensor circuit 100 may further include a sensor output value determination circuit 102 configured to determine a sensor output value based on at least one half-bridge sensor signal 103 provided by one of the half-bridge sensor circuits of the plurality of half-bridge sensor circuits 101. The sensor circuit 100 may further include an error determination circuit 104 configured to generate an error signal 107 based on a first half-bridge sensor signal 105a generated by a first half-bridge sensor circuit 101a of the plurality of half-bridge sensor circuits and a second half-bridge sensor signal 105b generated by a second half-bridge sensor circuit 101b of the plurality of half-bridge sensor circuits.

The sensor circuit 100 may further include a control circuit 106 configured to control, based on the error signal 107, a selection of one of the first half-bridge sensor circuit 101a and the second half-bridge sensor circuit 101b for providing one of the first half-bridge sensor signal 105a and the second half-bridge sensor signal 105b to the sensor output value determination circuit 102 to determine the sensor output value.

Due to the implementation of a sensor circuit having a control circuit to control a selection of one of a first half-bridge sensor circuit and a second-half-bridge sensor circuit based on an error signal, a faulty half-bridge sensor circuit may be replaced by a working half-bridge sensor circuit when an error is detected, for example. This may provide redundancy which may improve safety in automotive devices or vehicles, for example. Replacing the half-bridge sensor circuit may also avoid the complexity of replacing a full-bridge sensor circuit even if only one half of a full-bridge sensor circuit is faulty, for example. This may lead to reduced costs, for example.

The sensor circuit 100 may include a plurality of half-bridge sensor circuits 101 which may be arranged in a plurality of Wheatstone bridge formation or arrangement, for example. For example, the plurality of half-bridge sensor circuits 101 may be arranged to form one or more full-bridge sensor circuits comprising a pair of half-bridge sensor circuits each, for example. A full-bridge sensor circuit may include one half-bridge sensor circuit coupled between a supply voltage terminal and a reference voltage terminal (e.g. a ground terminal) and one complementary half-bridge sensor circuit coupled between the supply voltage terminal and the reference voltage terminal. The complementary half-bridge sensor circuit of the full-bridge sensor circuit may be identical or similar to the half-bridge sensor circuit of the full-bridge sensor circuit, but may be oppositely coupled between the supply voltage terminal and the reference voltage terminal. In other words, the complementary half-bridge sensor circuit of the full-bridge sensor circuit may have a different (e.g. an opposite or reverse) polarity with respect to the half-bridge sensor circuit of the full-bridge sensor circuit.

In the sensor circuit 100 arrangement, the half-bridge sensor circuits (e.g. all the half-bridge sensor circuits) of the plurality of half-bridge sensor circuits 101 may each include a first terminal electrically coupled to the supply voltage terminal and a second terminal electrically coupled to the reference voltage terminal. Each half-bridge sensor circuit 101 may include a pair of resistive elements, (e.g. magnetoresistive elements or Hall elements) which may respond to a stimulus (e.g. an external stimulus). The response of the resistive elements to such a stimulus may, for example, comprise a change in resistance of the resistive elements. Each half-bridge sensor circuit 101 may be configured to generate a half-bridge sensor signal in response to a change in external environment or stimulus, such as a change in magnetic field, or a change in pressure, for example.

The half-bridge sensor circuit 101 may be configured to generate the half-bridge sensor signal at a half-bridge sensor circuit output terminal (or node). For example, each half-bridge sensor circuit 101 may include a half-bridge sensor circuit output terminal arranged between a first resistive element and a second resistive element of the pair of resistive elements. The half-bridge sensor signals output at the output terminal of a half-bridge sensor circuit may be based on a voltage or current change due to the changes (or unbalances) in the resistive elements in response to the stimulus, for example. In some examples, the half-bridge sensor signal may be a sinusoidal signal, but is not limited thereto.

A first half-bridge sensor circuit 101a may be part of a first full-bridge sensor circuit. A second half-bridge sensor circuit 101b may be part of a second full-bridge sensor circuit. The second half-bridge sensor circuit 101b may be identical to the first half-bridge sensor circuit 101a and may be coupled to the supply voltage terminal and the reference voltage terminal with the same polarity as the first half-bridge sensor circuit 101a, for example. For example, a first half-bridge sensor signal 105a generated by the first half-bridge sensor circuit 101a may be a sinusoidal signal (e.g. a sine signal) having a first predetermined phase offset. Due to the same polarity and structure of the first half-bridge sensor circuit 101a, the second half-bridge sensor signal 105b generated by the second half-bridge sensor circuit 101b may also be a sinusoidal signal having the same first predetermined phase offset (e.g. a sine signal), for example. Therefore, it may be possible to replace the first half-bridge sensor circuit 101a with the second half-bridge sensor circuit 101b if the first half-bridge sensor circuit 101a is faulty, for example. In other words, the second half-bridge sensor circuit 101b may provide redundancy for the first half-bridge sensor circuit 101a.

The sensor circuit 100 includes the sensor output value determination circuit 102, which may be configured to determine the sensor output value based on at least one half-bridge sensor signal 103 provided by the plurality of half-bridge sensor signals, for example. In some examples, the sensor output value determination circuit 102 may be configured to determine the sensor output value based on two or four half-bridge sensor signals, for example. The sensor output value determination circuit 102 may be configured to determine the sensor output value based on one of the first half-bridge sensor signal 105a. the second half-bridge sensor signal 105b, a third half-bridge sensor signal provided by a third half-bridge sensor circuit, and a fourth half-bridge sensor signal provided by the fourth half-bridge sensor circuit. In other words, the sensor output value determination circuit 102 may be configured to determine the sensor output value based on either the first or second half-bridge sensor signal and based on either the third or fourth half-bridge sensor signal, for example.

The sensor output value determination circuit 102 may be configured to determine the sensor output value based on a third half-bridge sensor signal and one of the first half-bridge sensor signal 105a and the second half-bridge sensor signal 105b. The plurality of half-bridge sensor circuits may include a third half-bridge sensor circuit configured to provide the third half-bridge sensor signal, for example. The sensor output value determination circuit 102 may be configured to determine the sensor output value further based on either a first or second complementary half-bridge sensor signal generated by the first or second complementary half-bridge sensor circuit and based on either a third or fourth half-bridge sensor signal generated by the third or fourth complementary half-bridge sensor circuit, for example.

The sensor circuit 100 includes the error determination circuit 104, which may be configured to determine if a half-bridge sensor circuit is faulty, for example. For example, the error determination circuit 104 may be configured to generate the error signal 107 based on a comparison, an addition and/or a subtraction of the first half-bridge sensor signal 105a and the second half-bridge sensor signal 105b. In an example, the error determination circuit 104 may be configured to compare the first half-bridge sensor signal and the second half-bridge sensor signal 105b. For example, if a half-bridge sensor signal generated by a half-bridge sensor circuit is a continuous zero signal, (e.g. has a zero signal response) instead of an expected sinusoidal signal, the error determination circuit 104 may generate an error signal indicative of one of the first half-bridge sensor signal 105a and the second half-bridge sensor signal 105b being faulty. In another example, the error determination circuit 104 may generate an error signal if amplitude and/or phase of one of the first half-bridge sensor signal and the second half-bridge sensor signal deviates from each other by more than a threshold value e.g. by more than 1% or e.g. more than 5% or e.g. more than 10%.

In another example, the error determination circuit 104 may additionally, optionally or alternatively be configured to determine a difference between the first half-bridge sensor signal 105a generated by the first half-bridge sensor circuit 101a and the second half-bridge sensor signal 105b generated by the first half-bridge sensor circuit 101b. As both the first and second half-bridge sensor circuits are substantially identical, the sensor signals produced by them should be similar if both half-bridge sensor circuits are functioning correctly (e.g. amplitude and/or phase deviation of less than 1% of a phase and/or amplitude of one of the signals). The error determination circuit 104 may generate the error signal which may indicate a fault in one of the half-bridge sensor circuits, if a difference between the first half-bridge sensor signal 105a and the second half-bridge sensor signal 105b exceeds or falls below a reference threshold value (e.g. if a mid-range amplitude and/or phase value deviates more than 1% from a mid-range phase and/or amplitude value of one of the first half-bridge sensor signal 105a and the second half-bridge sensor signal 105b). In another example, the error determination circuit 104 may additionally, optionally or alternatively be configured to determine a sum of the first half-bridge sensor signal 105a and the second half-bridge sensor signal 105b. The error determination circuit 104 may generate the error signal which may indicate a fault in at least one of the half-bridge sensor signals, if a sum of the first half-bridge sensor signal 105a and the second half-bridge sensor signal 105b exceeds or falls below a reference threshold value or deviates from a reference signal, for example.

The error determination circuit 104 may additionally, optionally or alternatively be configured to generate the error signal 107 based on a comparison, an addition and/or a subtraction or determination of a difference of a further half-bridge sensor signal generated by a further half-bridge sensor circuit of the plurality of half-bridge sensor circuits, and the first half-bridge sensor signal 105a or the second half-bridge sensor signal 105b. The further half-bridge sensor circuit may be a third, or fourth or fifth half-bridge sensor circuit or any one or more half-bridge sensor circuits in the plurality of half-bridge sensor circuits, for example. For example, the error determination circuit 104 may be configured to carry out the comparison, addition and/or subtractions described herein, between at least one or both of the first half-bridge sensor signal 105a and the second half-bridge sensor signal 105b and the further half-bridge sensor signal, which allows a faulty half-bridge sensor circuit to be identified.

The error determination circuit 104 may be configured to transmit the error signal 107 to the control circuit 106 if a fault is detected in at least one of the first half-bridge sensor circuit 101a and the second half-bridge sensor circuit 101b. The control circuit 106 may be configured to select or to control a selection of one of the first half-bridge sensor circuit 101a and the second half-bridge sensor circuit 101b for providing a half-bridge sensor signal to the sensor output value determination circuit 102. The selection may be based on the error signal 107, for example. If no fault is detected, the error determination circuit 104 may be configured to transmit the error signal to the control circuit 106 indicating that no fault is detected, for example. In other words, the error signal may indicate a fault bridge or a working bridge to be selected.

The sensor circuit 100 includes the control circuit 106 configured to control a selection of the half-bridge sensor circuits used for providing the half-bridge sensor signals used by the sensor output value determination circuit 102 for determining the sensor output value. If an error signal is received by the control circuit 106, the control circuit may be configured to select or control a selection of a working identical half-bridge sensor circuit to replace the faulty half-bridge sensor circuit. If no faults are detected, the control circuit 106 may continue to select or control a selection of the same half-bridge sensor circuit until a fault is eventually detected, for example.

The sensor output value determination circuit 102 may be configured to determine the sensor output value based on half-bridge sensor signals from the selected half-bridge sensor circuits. For example, in a default configuration, the sensor output value determination circuit 102 may be configured to determine the sensor output value based on the first half-bridge sensor signal 105a provided by the first half-bridge sensor circuit 101a. The error determination circuit 104 may detect a fault in the first half-bridge sensor circuit 101a based on the first half-bridge sensor signal 105a and may transmit an error signal 107 to the control circuit 106. The control circuit 106 may select or control a selection of the second half-bridge sensor circuit 101b for providing the second half-bridge sensor signal 105b for determining a subsequent sensor output value instead of the first half-bridge sensor circuit 101*a* based on the transmitted error signal 107, for example.

The sensor output value determination circuit 102, the error determination circuit 104, the control circuit 106, and/or other optional units may be independent hardware units or part of a computer, a digital signal processor or a microcontroller or a computer program or a software product for running on a computer, a digital signal processor or a microcontroller, for example. The sensor output value determination circuit 102, the error determination circuit 104, the control circuit 106, and/or other optional components may be implemented independently from each other or may be realized at least partly together (e.g. on the same die or by the same computer program).

In some examples, the sensor circuit 100 may be implemented as an angle sensor, a magnetic sensor or a pressure sensor, for example. In an example, the sensor circuit 100 may be a rotation angle sensor. The sensor circuit 100 may be used to measure a rotation angle of a rotating part with respect to a reference axis, for example. Therefore, the sensor output value may be an angle value, a magnetic field value or a pressure value, for example. In some examples, the sensor circuit 100 may be a rotation angle detection sensor. The sensor circuit 100 may be implemented in an automotive vehicle or device, and may be used to measure a rotation angle of a rotating part of the automotive vehicle or device, e.g. a steering wheel, the rotating part generating a rotating magnetic field axis in the sensitive sensor plane.

In an example, the plurality of half-bridge sensor circuits 101 may include eight half-bridge sensor circuits. For example, the plurality of half-bridge sensor circuits 101 may include four full-bridge sensor circuits. A first full-bridge sensor circuit may be identical to a second full-bridge sensor circuit. A third full-bridge sensor circuit may be different from the first and second full-bridge sensor circuits and may be identical to a fourth full-bridge sensor circuit. The sensor circuit 100 may be configured to determine the sensor output value based on one of the first and second half/bridge sensor circuits and one of the third and fourth half/bridge sensor circuit. The other of the first and second half/bridge sensor circuits and the other of the third and fourth half/bridge sensor circuit may provide redundancy in case a half-bridge sensor circuit being used to determine the sensor output value develops a fault. An example is shown in FIG. 2.

Figure 2:
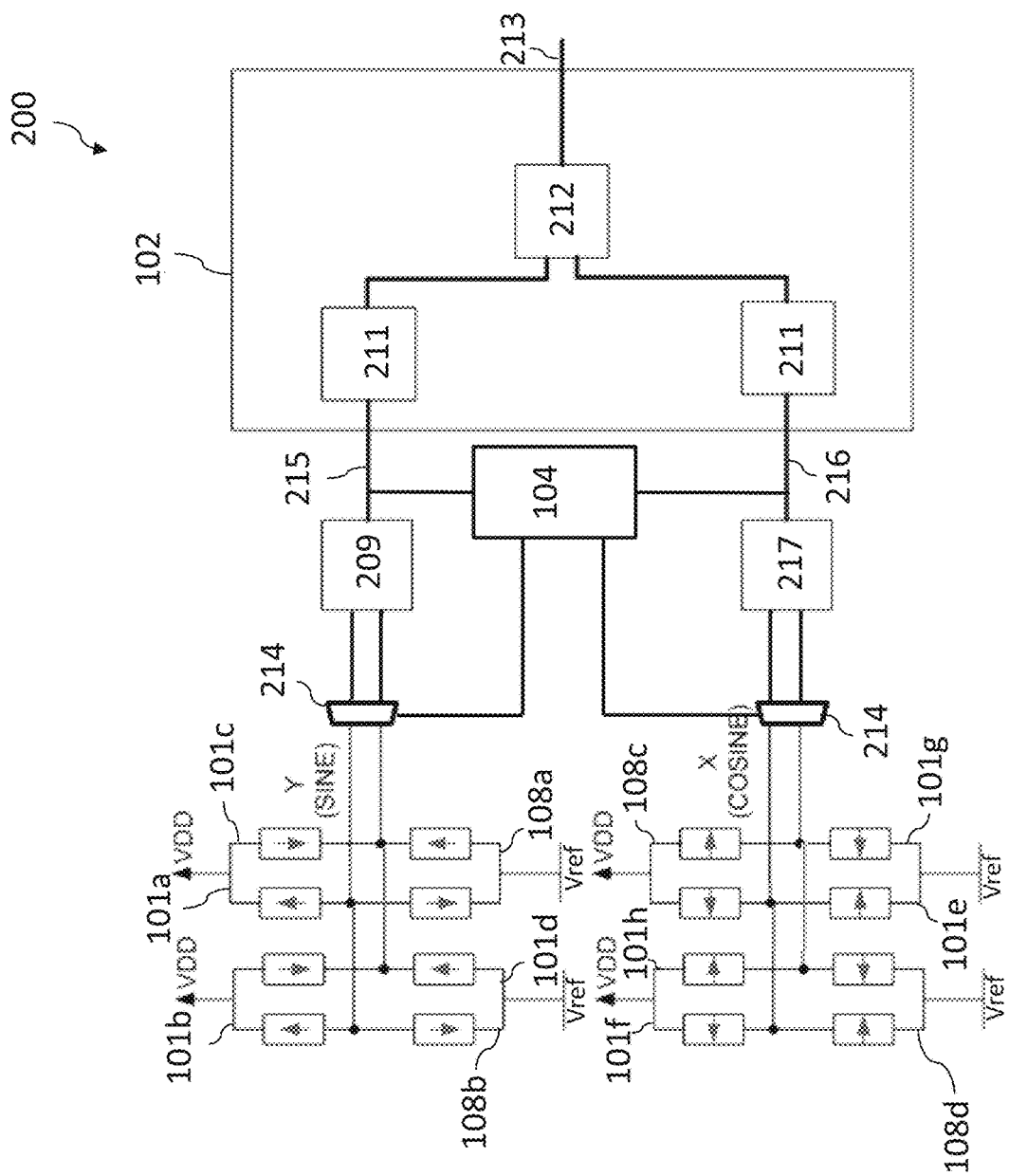
FIG. 2 shows a schematic illustration of a further sensor circuit.

FIG. 2 shows a schematic illustration of a sensor circuit 200 according to an embodiment.

The sensor circuit 200 may be similar to the sensor circuit described with respect to FIG. 1. For example, sensor circuit 200 may include four full-bridge sensor circuits. Each full-bridge sensor circuit may include a half-bridge sensor circuit and a complementary half-bridge sensor circuit, for example.

The sensor circuit 200 may be implemented as a magnetoresistive (e.g. xMR) angle sensor for example. For example, each magnetoresistive structure of the half-bridge sensor circuits may be an anisotropic magnetoresistive (AMR) structure, a giant magnetoresistive (GMR) structure or a tunnel (TMR) magnetoresistive structure. The sensor circuit may be suitable for AMR, GMR or TMR.

Each half-bridge sensor circuit may include a pair of magnetoresistive structures as resistive elements. For example, each half-bridge sensor circuit 101 of the sensor circuit 200 may include a pair of magnetoresistive structures. Each (or all) half-bridge sensor circuits of the plurality of half-bridge sensor circuits 101 may each include a first magnetoresistive structure and a second magnetoresistive structure. The first magnetoresistive structure and the second magnetoresistive structure may have complementary electrical properties upon an external magnetic field. The first magnetoresistive structure and the second magnetoresistive structure of the same half-bridge sensor circuit may have different predefined reference magnetization directions (indicated by the arrows as the sensitive magnetization directions). The first magnetoresistive structure and the second magnetoresistive structure of the same half-bridge sensor circuit may have opposite predefined reference magnetization directions.

The predefined reference magnetization direction of a magnetoresistive structure may be a fixed magnetic orientation of a pinned layer of the magnetoresistive structure, but is not limited thereto. The magnetoresistive structure may include an anti-ferromagnetic layer The pinned layer may be held in the fixed magnetic orientation due to the exchange bias effect between the anti-ferromagnetic layer and the ferromagnetic pinned layer. A sensing layer (or free layer) may be separated from the pinned layer by a non-magnetic spacer layer. Based on a stimulus e.g. a change of a magnetic field due to movement of magnetic rotating member in proximity to the sensor circuit 200, the magnetoresistive structures of the plurality of half-bridge sensor circuits of the sensor circuit 200 may exhibit a change in resistance. For example, electrons in the free layer of the first magnetoresistive structure may tend to align in a same first predefined reference magnetization direction as the pinned layer of the first magnetoresistive structure. This may lead to the first magnetoresistive structure having a reduced resistance. Additionally, electrons in the free layer of the second magnetoresistive structure may tend to align in an opposite direction to the second predefined reference magnetization direction as the pinned layer of the second magnetoresistive structure. This may lead to the first magnetoresistive structure having an increased resistance but is not limited thereto. The changes in resistance and the different responses exhibited by the first magnetoresistive structure and the second magnetoresistive structure may lead to a change in voltage or current at an output terminal between the first magnetoresistive structure and the second magnetoresistive structure of the half-bridge sensor circuit. In other words, a half-bridge sensor signal may (e.g. a voltage or current signal) be generated by the half-bridge sensor circuit which varies (e.g. in a sinusoidal manner) with the change in angular rotation, for example.

Each half-bridge sensor circuit may include a first magnetoresistive structure having a first terminal coupled to the supply voltage terminal and a second terminal electrically coupled in series to a first terminal of a second magnetoresistive structure. A second terminal of the second magnetoresistive structure may be electrically coupled to the reference terminal (e.g. a ground terminal). An oppositely coupled half-bridge sensor circuit may include a first magnetoresistive structure having a first terminal coupled to the reference terminal and a second terminal electrically coupled to a first terminal of a second magnetoresistive structure. A second terminal of the second magnetoresistive structure may be electrically coupled to the supply voltage terminal. Due to the opposite polarity of complementary half-bridge sensor circuits, the complementary half-bridge sensor circuit in a full-bridge sensor circuit may produce sinusoidal signals with the 180° phase-offset with respect to its corresponding other half-bridge sensor circuit in the full-bridge sensor circuit arrangement.

For example, the sensor circuit 200 may include a first full-bridge sensor circuit 108*a* including the first half-bridge sensor circuit 101a and a first complementary half-bridge sensor circuit 108c. The first half-bridge sensor circuit may include a first magnetoresistive structure having a first predefined reference direction (e.g. a 0° reference offset) and a second magnetoresistive structure having a second predefined reference direction (e.g. a 180° reference offset with respect to the first predefined reference direction). The first half-bridge sensor signal generated by the first half-bridge sensor circuit 101a of the first full-bridge sensor circuit 108a may be a sinusoidal signal having a first predetermined phase offset, e.g. a 0° phase-offset, with respect to a pure sine function for example. The first complementary half-bridge sensor circuit 101c may include a first magnetoresistive structure having the same first predefined reference direction (e.g. a 0° reference offset) and a second magnetoresistive structure having the second predefined reference direction (e.g. a 180° reference offset with respect to the first predefined reference direction). Due to its different (or e.g. opposite) polarity, a complementary half-bridge sensor signal generated by the first complementary half-bridge sensor circuit 101c of the full-bridge sensor circuit 108a may be a sinusoidal signal having a second predetermined phase offset e.g. a 180° phase-offset with respect to the first predetermined phase offset of the first half-bridge sensor signal, for example. For example, the first half-bridge sensor signal may be a positive sine signal. Due to its different (or e.g. opposite) polarity, the first complementary half-bridge sensor signal generated by the first complementary half-bridge sensor circuit 101c of the first full-bridge sensor circuit 108a may be a negative sine signal.

The sensor circuit 200 may further include a second full-bridge sensor circuit 108b including the second half-bridge sensor circuit 101b and a second complementary half-bridge sensor circuit 101d. The second full-bridge sensor circuit may be identical to the first full-bridge sensor circuit, for example. Due to the same polarity and structure as the first half-bridge sensor circuit 101a, a second half-bridge sensor signal generated by the second half-bridge sensor circuit 101b may also be a sinusoidal signal having the same first predetermined phase offset as the first half-bridge sensor signal. The second half-bridge sensor signal may instead be a positive sine signal. The second complementary half-bridge sensor signal generated by the second complementary half-bridge sensor circuit 101d may have the same second predetermine phase offset as the first complementary half-bridge sensor signal. For example, the second complementary half-bridge sensor signal may be a negative sine signal.

The sensor circuit 200 may further include a third full-bridge sensor circuit 108c including a third half-bridge sensor circuit 101e and a third complementary half-bridge sensor circuit 101g. The third half-bridge sensor circuit 101c may include a first magnetoresistive structure having a third predefined reference direction (e.g. a 90° reference offset in GMR structure) and a second magnetoresistive structure having a fourth predefined reference direction (e.g. a 270° reference offset with respect to the first predefined reference direction). The third half-bridge sensor signal generated by the third half-bridge sensor circuit may have a (third) predefined phase-offset with respect to at least one of the first half-bridge sensor signal and the second half-bridge sensor signal. For example, the predefined phase-offset may be a 90° phase-offset (for a GMR structure). For example, the third half-bridge sensor signal may be a cosine signal. The third complementary half-bridge sensor circuit 101c may include a first magnetoresistive structure having the same third predefined reference direction (e.g. a 90° reference offset) and a second magnetoresistive structure having the same fourth predefined reference direction (e.g. a 270° reference offset with respect to the first predefined reference direction). Due to its different (or e.g. opposite) polarity, the third complementary half-bridge sensor signal generated by the third complementary half-bridge sensor circuit 101g of the third full-bridge sensor circuit 108c may be a sinusoidal signal having a (fourth) predetermined phase offset (e.g. a 270° phase-offset in the case of GMR structures) with respect to the first half-bridge sensor signal, and a 180° phase off-set with respect to the third half-bridge sensor signal. Likewise, the third complementary half-bridge sensor signal may be a negative cosine signal.

The sensor circuit 200 may further include a fourth full-bridge sensor circuit 108d including a fourth half-bridge sensor circuit 101f and a fourth complementary half-bridge sensor circuit 101h. The fourth full-bridge sensor circuit may be identical to the third full-bridge sensor circuit without limitation. Due to the same polarity and structure as the third half-bridge sensor circuit 101e, the fourth half-bridge sensor signal generated by the fourth half-bridge sensor circuit 101f may also be a sinusoidal signal having the same (third) predetermined phase offset as the third half-bridge sensor signal, for example. For example, the fourth half-bridge sensor signal may be a positive cosine signal. The fourth complementary half-bridge sensor signal generated by the fourth complementary half-bridge sensor circuit 101h may have the same (fourth) predetermine phase offset as the third complementary half-bridge sensor signal. The fourth complementary half-bridge sensor signal 101h may be a negative cosine signal without limitation.

In a default selection, the first full-bridge circuit 108a and the third full-bridge circuit 108c may be selected by the control circuit 106 for determining a sensor output value based on half-bridge sensor signals provided by the first full-bridge circuit and the third full-bridge circuit. The control circuit 106 may be configured to control or may include at least one multiplexer circuit (e.g. multiplexer circuits 214) configured to select at least one further half-bridge sensor circuit of the plurality of half-bridge sensor circuits, and at least one of the first half-bridge sensor circuit and the second half-bridge sensor circuit for providing half-bridge sensor signals for generating the sensor output value. For example, the first half-bridge sensor signal, the first complementary half-bridge sensor signal, the third half-bridge sensor signal and the third complementary half-bridge sensor signal may be used by the sensor output value determination circuit 102 for determining the sensor output value. In an example, each of these signals may be transmitted to sensor output value determination circuit 102. For example, the sensor output value determination circuit 102 may be configured to determine a sensor output value based on a first half-bridge sensor signal V1+ (e.g. a+sin θ signal) and a third half-bridge sensor signal V3+ (e.g. a+cos θ signal). Furthermore, the sensor output value determination circuit 102 may be configured to determine a sensor output value based on a first complementary half-bridge sensor signal V1− (e.g. a−sin θ signal) and a third complementary half-bridge sensor signal V3− (e.g. a−cos θ signal). In another example, signals based on a summation of the selected half-bridge sensor signals may be transmitted to the sensor output value determination circuit 102. For example, signals V3 and V1 may be transmitted to the sensor output value determination circuit 102, where V3=V3+−V3− (cosine signals) and V1=V1+−V1− (sine signals). In these examples, the sine signals may be transmitted to the sensor output value determination circuit 102 via a first transmit path 215, for example. The cosine signals may be transmitted to the sensor output value determination circuit 102 via a second transmit path 216, for example.

The sensor circuit 200 may further include at least one analog to digital converter (ADC) circuit 209 configured to generate a digital sensor signal based on an analog half-bridge sensor signal provided by a half-bridge sensor circuit selected by the control circuit. The ADC circuit may be configured to generate a digital sensor signal based on an analog half-bridge sensor signal provided by a half-bridge sensor circuit selected by the at least one multiplexer circuit. The ADC circuit may be electrically coupled between the plurality of half-bridge sensor circuits and the sensor output value determination circuit 102, for example. The sensor circuit 200 may include a first ADC circuit 209 coupled to first and second full-bridge sensor circuits and the sensor output value determination circuit 102. For example, the first ADC circuit 209 may further be electrically coupled to the control circuit 106 and the sensor output value determination circuit 102. The first ADC circuit 209 may be configured to generate a first digital sensor signal based on the sine signals, e.g. based on at least one of the first half-bridge sensor signal (V1+) and the first complementary half-bridge sensor signal (V1−), for example. For example, the first ADC circuit may be configured to generate the digital sensor signal based on an addition or subtraction of the first half-bridge sensor signal (V1+) and the first complementary half-bridge sensor signal (V1−), for example. The first digital sensor signal may be transmitted to the sensor output value determination circuit 102 via the first transmit path 215. Analogously, the sensor circuit 200 may include a second ADC circuit 217 electrically coupled to the third and fourth full-bridge sensor circuits and the sensor output value determination circuit 102. For example, the second ADC circuit 217 may further be electrically coupled to the control circuit 106 and the sensor output value determination circuit 102. The second ADC circuit 217 may be configured to generate a second digital sensor signal based on the cosine signals, e.g. at least one of the third half-bridge sensor signal (V3+) and the third complementary half-bridge sensor signal (V3−), for example. The second digital sensor signal may be transmitted to the sensor output value determination circuit 102 via the second transmit path 216. The second digital sensor signal may also be used for the determination of the sensor output value, for example.

The sensor output value determination circuit 102 may be configured to carry out digital signal processing on the received digital sensor signals, for example. The sensor output value determination circuit 102 may be a digital signal processor. For example, the sensor circuit may further include an amplitude offset correction circuit 209 configured to correct an amplitude offset of the digital sensor signals. The amplitude offset correction circuit 211 may be used to correct offsets, (e.g. offsets caused by temperature fluctuations or temperature drift). For example, the sensor output value may be determined based on the corrected digital sensor signals. In an example, the amplitude offset correction circuit 211 may be a part of the sensor output value determination circuit 102. The sensor output value determination circuit 102 may include an angle calculation circuit 212 configured to determinate or calculate the sensor output value which may be an angle value.

In an example of a default operation mode, the first half-bridge sensor circuit and the first complementary half-bridge sensor circuit of the first full-bridge sensor circuit and the third half-bridge sensor circuit and the third complementary half-bridge sensor circuit of the third full-bridge sensor circuit may be selected by the control circuit 106 for each providing half-bridge sensor signals for determining the sensor output value. Accordingly, the sensor output value determination circuit 102 may be configured to determine the sensor output value based on a first half-bridge sensor signal V1+ (e.g. a+sin θ signal) and a third half-bridge sensor signal V3+ (e.g. a+cos θ signal). The sensor output value may be based on or equal to θ which may be calculated based on the first half-bridge sensor signal and a third half-bridge sensor signal. For example, θ may be a value based on or equal to the rotation angle, for example. θ may be obtained by an inverse tangent (e.g. arc tan or $\tan^{-1}$) calculation based on the first half-bridge sensor signal and the third half-bridge sensor signal, for example. To provide an angle measurement accuracy over 360°, the sensor output value determination circuit 102 may be configured to determine a sensor output value additionally based on the first complementary half-bridge sensor signal V1− (e.g. a−sin θ signal) and the third complementary half-bridge sensor signal V3− (e.g. a−cos θ signal), for example. The sensor output value may be determined based on the corrected digital half-bridge signals, e.g. the digitally corrected first half-bridge sensor signal and the third half-bridge sensor signal, and the digitally corrected first complementary half-bridge sensor signal and the third complementary half-bridge sensor signal.

The sensor output value determination circuit 102 may be configured to determine the sensor output value, e.g. θ, based on the equation $\tan^{-1}$ V1/V3.

The sensor circuit 200 may further include an output interface circuit 212 configured to transmit the sensor output value to a receiver, for example. The error determination circuit 104 may be configured to perform a comparison, addition and/or subtraction of the half-bridge sensor signals of the plurality of half-bridge sensor circuits during the transmission of the sensor output value by the output interface circuit 212.

For determining faulty or working half-bridge sensor circuits, the error determination circuit 104 may include a test circuit configured to provide test instructions to the at least one multiplexer circuit 214 for controlling the selection of half-bridge sensor (test) signals. For example, the multiplexer circuit 214 may be configured to select at least one reference terminal (e.g. a reference ground terminal) and at least one first half-bridge sensor signal. The first half-bridge sensor selected by the multiplexer circuit 214 may be ADC-converted to a digital first half-bridge sensor signal and transmitted to the error determination circuit 104 and stored, for example. Subsequently, the multiplexer circuit 214 may be configured to select at least one reference terminal (e.g. a reference ground terminal) and at least one second half-bridge sensor signal. The second half-bridge sensor selected by the multiplexer circuit 214 may be ADC-converted to a digital second half-bridge sensor signal and transmitted to the error determination circuit 104 and stored. The error determination circuit 104 may be configured to perform the comparison, addition and/or subtraction based on the first and second digital half-bridge sensor signals, for example.

In an example, based on the test instructions, the at least one multiplexer circuit 214 may be configured to select the first half-bridge sensor signal and the second half-bridge sensor signal together. The first half-bridge sensor signal may be ADC-converted to a digital first half-bridge sensor signal by a first ADC circuit and the second half-bridge sensor signal may be ADC-converted to a digital second half-bridge sensor signal by a second ADC circuit before being transmitted to error determination circuit 104.

In an example, based on the test instructions, the multiplexer circuit 214 or a further multiplexer circuit may be configured to select at least one further half-bridge sensor circuit of the plurality of half-bridge sensor circuits, and at least one of the first half-bridge sensor circuit 101a and the second half-bridge sensor circuit 101b for providing half-bridge sensor signals for generating the error signal.

The detection of faulty half-bridge sensor circuits by the error determination circuit 104 may be based on a comparison, an addition, or a subtraction of a (digital) first half-bridge sensor signal 101a and a (digital) second half-bridge sensor signal 101b, and a further comparison, addition, and/or subtraction of at least one other (digital) half-bridge sensor signal with the (digital) first half-bridge sensor signal 101a and the (digital) second half-bridge sensor signal 101b.

The at least one multiplexer circuit 214 may be electrically coupled to or may be part of the control circuit 106, for example. Based on the comparison (or addition or) of half-bridge sensor signals, if any one of the half-bridge sensor circuits develops a fault, the error determination circuit 104 may be configured to generate an error signal and the control circuit 106 may be configured to select a properly functioning half-bridge sensor circuit to replace a faulty half-bridge sensor circuit, for example. The error determination circuit 104 (e.g. the test circuit) may be configured to generate the error signal during the transmission of the sensor output value by the output interface circuit 213. For example, the test circuit may provide the test instructions during the transmission of the output parameter and/or directly after the determination of the sensor output value and before the determination of a succeeding sensor output value. In this way, dead times may be used for executing test procedures to increase the reliability and/or the availability of the sensor circuit 200.

Optionally, the test circuit may execute the test repeatedly after a predefined number (e.g. after every, every second value, every third value, every tenth value or another integer number) of values of the output parameter are transmitted. It may be sufficient to repeat the test every n-th transmission of the output parameter to improve the reliability and/or the availability of the sensor circuit significantly. Alternatively or additionally, the test circuit may execute the test repeatedly at equal time intervals. For example, the test circuit may execute the test at repeated time intervals. The repeated time intervals may comprise a length between 1 ms and 50 ms (or between 2 ms and 20 ms or between 5 ms and 10 ms, e.g. 1 ms, 5 ms, 10 ms or 20 ms).

The control circuit 106 (e.g. including the multiplexer 214) may be configured to select or to control a selection of the second half-bridge sensor circuit 101b to replace the first half-bridge sensor circuit 101 based on the error signal (e.g. if a first half-bridge sensor circuit is determined to be faulty). Then, the half-bridge sensor signal from the (newly selected) second half-bridge sensor circuit 101b may be used to determine a subsequent sensor output value in a subsequent measurement. If no fault is detected in the error determination circuit 104, the control circuit 106 may continue to select or to control a selection of the first half-bridge sensor circuit 101a for providing the half-bridge sensor signal to the sensor output value determination circuit 102, for example. In other words, the control circuit 106 may be configured to select or to control a selection of one of the first half-bridge sensor circuit 101a and the second half-bridge sensor circuit 101b during the transmission of the sensor output value by the output interface circuit, for example.

Replacing a faulty half-bridge sensor circuit with an identical (redundant) half-bridge sensor circuit may avoid the complexity of replacing a full-bridge sensor circuit even if only one half of the full-bridge sensor circuit is faulty. This may lead to reduced costs, for example.

For angle sensors, a safety goal may be to guarantee a dedicated angle accuracy in a predefined time (e.g. 5° deviation of the true angle value may have to be detected in 5 ms). A challenge to be overcome may be how to guarantee the validity of the sensed value without a second Independent sense element. xMR Angle Sensors may have two different Wheatstone sensor-bridges, each generating a sinusoidal signal, e.g. one sine component and one cosine component. This two-fold signal generation is well suited for safety critical applications because of the usage of two different signal paths being used. It is to be noted that only one single angle value is generated out using the two signal paths. Once this single angle signal is generated, redundancy (provided by the two individual signal paths) is lost. It may be of interest for safety critical applications to provide availability or even enhance the availability of a programmable unit, such as the angle sensor. While with the approach described above redundancy is lost at the benefit of an increased reliability of the angle sensor or system. The system is still operable, hence available, with even one of the half-bridges being faulty or identified as unreliable.

It may appear contradictory that one of the key elements of functional safety is to indicate an error immediately and to provide the information that a dedicated sensor value is not valid anymore. However in such a case a warning may be provided or the transmission of the sensor information as in indicating the measured angle, may be stopped. The error correction unit may be responsible to react to meet safety requirements leading to a reduction of availability. A high ASIL Level and high availability may be achieved by combining sensors and double signal paths, for example. A high availability may increase the ASIL Level. In case one (first) path shows an error, a second path may be used for function purposes and for safety purposes, for example. In other words, in case of the first path showing the error, a warning may be issued and/or signals received from the first path may be ignored or overwritten. It may be of interest to implement the plurality of sensor elements based on xMR technology as a non-limiting example.

Two (full) bridges may be used for an angle sensor allowing the extraction of a sine and cosine signal. To some extent the provided information may be redundant (sine and cosine) but due to the dependency between the two, (e.g. between the sine signal and the cos signal), it may only be used for safety or availability purposes, for example.

More details and aspects are mentioned in connection with the embodiments described above or below (e.g. the half-bridge sensor circuits, the full-bridge sensor circuits the sensor output value determination circuit, the magnetoresistive structures, the error determination circuit, the control circuit and the sensor output value determination circuit). The embodiments shown in FIG. 2 may comprise one or more optional additional features corresponding to one or more aspects mentioned in connection with the proposed concept or one or more embodiments described above (e.g. FIG. 1) or below (e.g. FIGS. 3 to 7).

Figure 3:
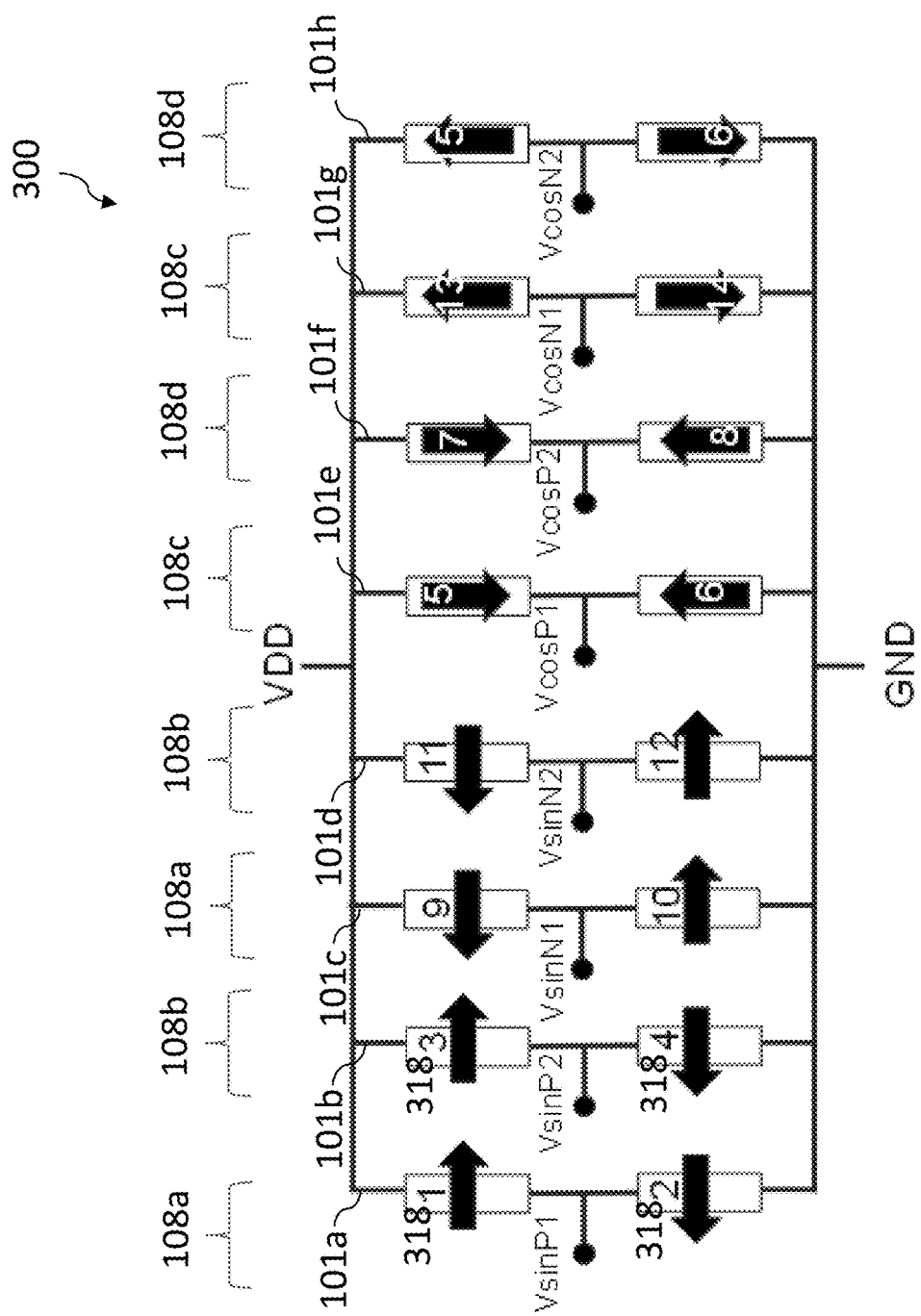
FIG. 3 shows a schematic illustration of a further sensor circuit.

FIG. 3 shows a schematic illustration of a sensor circuit according to an embodiment. The sensor circuit 300 may be similar to the sensor circuits described in FIGS. 1 and/or 2.

The sensor circuit 300 may be implemented in at least one semiconductor substrate, for example. The semiconductor substrate may be a semiconductor die or may include part of a semiconductor wafer, for example. The semiconductor substrate may be a silicon-based semiconductor substrate, or silicon carbide-based semiconductor substrate, or gallium arsenide-based semiconductor substrate or gallium nitride-based semiconductor substrate, for example.

In the sensor circuit 300, each default full-bridge sensor circuit (e.g. 108*a*) may be formed in proximity to an identical redundant full-bridge sensor circuit (e.g. 108*b*). The (redundant) full-bridge sensor circuit (e.g. 108*b*) may have identical magnetoresistive structures as the default full-bridge sensor circuit (e.g. 108*a*) and may also be coupled between the supply voltage (e.g. VDD) and the reference voltage (e.g. ground GND) with an identical polarity as the default full-bridge sensor circuit, for example.

Additionally, each default half-bridge sensor circuit may be formed adjacently to an identical redundant half-bridge sensor circuit. For example, the first (default) half-bridge sensor circuit 101*a* may be formed adjacently to the second (redundant) half-bridge sensor circuit 101*b*, for example. Similarly, the first (default) complementary half-bridge sensor circuit 101*c* may be formed adjacently to the second complementary (redundant) half-bridge sensor circuit 101*d*, for example. Similarly, the third (default) half-bridge sensor circuit 101*e* may be formed adjacently to the fourth (redundant) half-bridge sensor circuit 101*f*, for example. Similarly, the third (default) complementary half-bridge sensor circuit 101*g* may be formed adjacently to the fourth complementary (redundant) half-bridge sensor circuit 101*h*, for example.

Due to the arrangement of a default half-bridge sensor circuit adjacent to an identical (redundant) half-bridge sensor circuit, a redundancy may be obtained, and the redundant half-bridge sensor circuit may be exposed to the same magnetic field conditions as the default half-bridge sensor circuit, for example. Therefore, errors generated due to different field conditions experienced between an original half-bridge sensor circuit and a corresponding redundant half-bridge sensor circuit may be reduced or eliminated should the original half-bridge sensor circuit be replaced by the corresponding redundant half-bridge sensor circuit, for example.

For example, the plurality of half-bridge sensor circuits may be arranged so that a magnetoresistive structure (e.g. a default) having a predefined reference magnetization direction may be formed adjacently to an identical (e.g. a redundant) magnetoresistive structure having the same predefined reference magnetization direction. For example, a first (default) magnetoresistive structure $318_1$ of the first half-bridge sensor circuit 101*a* having a first predefined reference magnetization direction may be formed adjacently to a first (redundant) magnetoresistive structure $318_3$ of the second half-bridge sensor circuit 101*b* having the same first predefined reference magnetization direction, for example. Similarly, a second magnetoresistive structure $318_2$ of the first half-bridge sensor circuit 101*a* having a second predefined reference magnetization direction may be formed adjacently to the second magnetoresistive structure $318_4$ of the second half-bridge sensor circuit 101*b* having the same second predefined reference magnetization direction, for example.

In the examples described herein (above and below), the term "adjacent" or "adjacently" is used herein to mean that adjacent elements lie alongside or beside each other. For example, a magnetoresistive structure may have at least one lateral side or surface facing an adjacent magnetoresistive structure. For example, about between about 50% to about 100% of a lateral side or surface of the magnetoresistive structure may directly face a lateral side of the adjacent magnetoresistive structure. The term "adjacent" or "adjacently" is also used herein emphasize the proximity of adjacent elements in comparison to other elements, for example. In particular, areas between an adjacent default half-bridge sensor circuit and its redundant identical half-bridge sensor circuit may be free from other half-bridge sensor circuits, for example. In other words, no other half-bridge sensor circuits may be formed in the area between a default half-bridge sensor circuit and the redundant half-bridge sensor circuit. For example, areas between the first (default) half-bridge sensor circuit 101*a* and the second (redundant) half-bridge sensor circuit 101*b* may be free from other half-bridge sensor circuits, particularly, half-bridge sensor circuits which have non-identical magnetoresistive structures to the first and the second half-bridge sensor circuit 101*b*.

In an example, the first full-bridge sensor circuit and the second full-bridge sensor circuit may also be formed adjacently on the common semiconductor substrate. For example, the first half-bridge sensor circuit 101*a* and the second half-bridge sensor circuit 101*b* may be formed adjacently on the common semiconductor substrate. For example, the (first) magnetoresistive structures having the first predefined reference magnetization direction (e.g. $318_1$ and $318_3$) may be formed in a first common area of the common semiconductor substrate. Magnetoresistive structures having the same (e.g. first) predefined reference magnetization direction may be formed in the first common area. For example, the (first) magnetoresistive structures of the first half-bridge sensor circuit 101*a* and the second half-bridge sensor circuit 101*b* having the same first predefined reference magnetization direction may be formed in the first common area. No magnetoresistive structures having a different predefined reference magnetization direction to the first predefined reference magnetization direction are formed in the first common area, for example. A default magnetoresistive structure (e.g. of the first half-bridge sensor circuit) may be spatially separated from a redundant identical magnetoresistive structure (e.g. of the second half-bridge sensor circuit) by a distance in a lateral or horizontal direction substantially parallel to the main surface of the semiconductor substrate.

The (second) magnetoresistive structures having the second predefined reference magnetization direction (e.g. $318_2$ and $318_4$) may be formed in a second common area of the common semiconductor substrate. Analogously, the (second) magnetoresistive structures of the first half-bridge sensor circuit 101*a* and the second half-bridge sensor circuit 101*b* having the same second predefined reference magnetization direction may be formed in the second common area. No magnetoresistive structures having a different predefined reference magnetization direction to the second predefined reference magnetization direction are formed in the second common area, for example.

The second common area may be different from the first common area. For example, the first common area and the second common area may be adjacent (or e.g. directly adjacent common areas). In some examples, the first common area and the second common area may have a horizontal separation. For example, the first common area and the second common area may be formed on the same layer level on the semiconductor substrate, for example. The second common area and the first common area may have a lateral spatial separation within the same layer level of the semiconductor substrate, for example. A layer level may refer to a planar (substantially horizontal) level, substantially parallel to a main surface of the semiconductor substrate, wherein a diameter of the main surface may be more at least 10 to 100 times greater than the thickness of the semiconductor substrate, for example.

In other examples, the first common area and the second common area may have a vertical separation. The first magnetoresistive structures of the first half-bridge sensor circuit 101a and the second half-bridge sensor circuit 101b having the same first predefined reference magnetization direction may be formed in the first layer level. Furthermore, second magnetoresistive structures of the first half-bridge sensor circuit 101a and the second half-bridge sensor circuit 101b having the second predefined reference magnetization direction may be formed at a second layer level of the common semiconductor substrate. For example, the first half-bridge sensor circuit 101a and the second half-bridge sensor circuit 101b may each include vertically stacked magnetoresistive structures, for example. For example, the second layer level may have a vertical spatial offset relative to the first layer level, perpendicular to the main surface of the common semiconductor substrate.

The half-bridge sensor circuits of the third and fourth full-bridge sensor circuits may also be arranged according to similar principles as the first and second full-bridge sensor circuits, for example. For example, magnetoresistive structures having the same third predefined reference magnetization directions may be formed in a third common area of a semiconductor substrate and magnetoresistive structures having the same fourth predefined reference magnetization directions may be formed in a fourth common area of a semiconductor substrate. The third and fourth full-bridge sensor circuits may be formed on the same or on a different semiconductor substrate as the first and second full-bridge sensor circuits, for example.

A first magnetoresistive structure (of each half-bridge sensor circuit) may be electrically coupled to a second magnetoresistive structure (of the same half-bridge sensor circuit) via one or more electrically conductive structures (e.g. electrical interconnects), for example. The electrical interconnects may include copper or aluminum or any electrically conductive material, for example.

FIG. 3 further shows a schematic arrangement of half-bridges for two angle sensors; the arrows indicate the reference magnetization direction in case the resistors are based on GMR or TMR structures, for example. The schematic arrangement shows 8 half-bridges, (e.g. two full-bridge sensors). For magnetoresistive resistors based on the AMR technology the different reference magnetization directions may be represented by different current directions, for example.

Two spatially separated sensors with two sine and cosine bridges may be used to achieve a redundancy effect. In case one sensor or half-bridge of one full-bridge fails, this full-bridge may no longer be considered for data acquisition and the second full-bridge may be chosen instead. However, two spatially separated sensors might be exposed to different field conditions depending on the magnetic circuit. As a result, the redundant sensor bridge might not be a full replacement of the damaged one. To achieve a comparable performance of the two sensors, both sensors cannot be placed at their optimum position regarding the external magnetic field. As a consequence, the sensor accuracy might be reduced.

The sensor circuits described here may include at least two magnetic sensors having convoluted/interlaced half-bridges. Identical resistors and half-bridges, respectively, may be placed next to each other and therefore, may be exposed to almost identical field conditions. Altogether, 8 half-bridges are connected in parallel, generating 8 half-bridge sensor signals, for example.

The functionality of each half-bridge may be checked by measuring the differential output signal of two neighboring identical half-bridges; due to the almost identical field conditions, both half-bridges should exhibit substantially the same signal. In case one of the half-bridges of the same kind is damaged, different signals are measured and further checks may be initiated to identify the damaged half-bridge. It may be of interest to use a third half-bridge and a corresponding third half-bridge signal may be consulted in order to decide which of the two half-bridges showing different signals appears to be damaged. As a further step the half-bridge identified as being damaged may be excluded from future evaluations. If one half-bridge was identified to be damaged, the other neighboring half-bridge may be selected for the angle calculation, since the second half-bridge is exposed substantially exposed to the same field condition; the half-bridge arrangement according to the invention offers a real redundancy, for example.

In case of GMR or TMR sensor structures, locally different reference magnetizations may be provided. One possible technique is the laser magnetization process where the resistors are locally heated within a magnetic field above a critical temperature (blocking temperature) and cooled down. The examples described herein may allow a local heating of all 4 resistors with identical reference magnetization direction, thereby saving process time as well as active area size.

More details and aspects are mentioned in connection with the embodiments described above or below (e.g. the half-bridge sensor circuits, the full-bridge sensor circuits the sensor output value determination circuit, the magnetoresistive structures, the error determination circuit, the control circuit, the sensor output value determination circuit, the arrangement of the magnetoresistive structures, the common areas of the semiconductor substrate and the layer levels of the semiconductor substrate). The embodiments shown in FIG. 3 may comprise one or more optional additional features corresponding to one or more aspects mentioned in connection with the proposed concept or one or more embodiments described above (e.g. FIGS. 1 and 2) or below (e.g. FIGS. 4 to 7).

Figure 4:
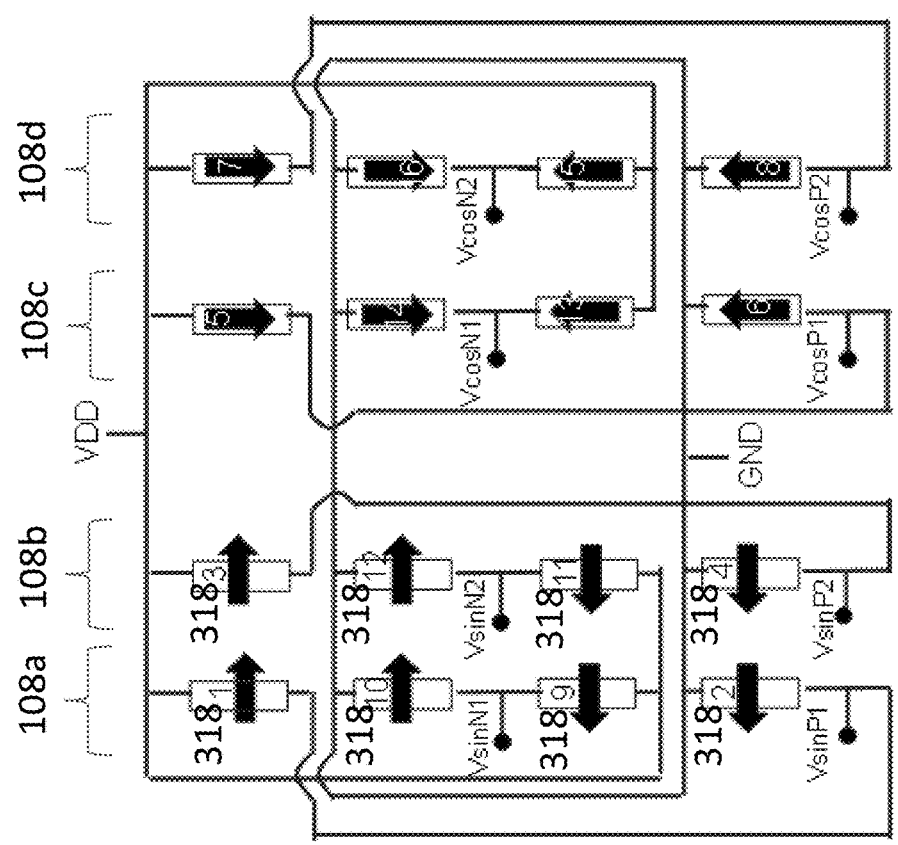
FIG. 4 shows a schematic illustration of a further sensor circuit.

FIG. 4 shows a schematic illustration of a sensor circuit 400 according to an embodiment. The sensor circuit 400 may be similar to the sensor circuits described in FIGS. 1 to 3.

In sensor circuit 400, the first (default) full-bridge sensor circuit 108a may be formed adjacently to the second (redundant) full-bridge sensor circuit 108b, for example. Similarly, the third (default) full-bridge sensor circuit 108c may be formed adjacently to the fourth (redundant) full-bridge sensor circuit 108d, for example.

Furthermore, the plurality of half-bridge sensor circuits may be arranged so that all magnetoresistive structures having a same first predefined reference magnetization direction are be formed in a first common area (or the first layer level) and all the magnetoresistive structures having a same predefined second reference magnetization direction are formed in the second common area (at the same first layer level or the second layer level), for example.

The first magnetoresistive structures $318_1$, $318_3$ of the first half-bridge sensor circuit 101a and the second half-bridge sensor circuit 101b and the first magnetoresistive structures $318_{10}$, $318_{12}$ of the first and the second complementary half-bridge sensor circuit having the same first predefined reference magnetization direction may be formed in the first common area (or the first layer level). Furthermore, the magnetoresistive structures of the first half-bridge sensor circuit 101a and the second half-bridge sensor circuit 101b having the same first predefined reference magnetization direction may be formed adjacently to each other, and the magnetoresistive structures of the first complementary half-bridge sensor circuit 101a and the second complementary half-bridge sensor circuit 101b having the same first predefined reference magnetization direction may be formed adjacently to each other in the first common area. The second magnetoresistive structures $318_2$, $318_4$ of the first half-bridge sensor circuit 101a and the second half-bridge sensor circuit 101b and the second magnetoresistive structures $318_9$, $318_{11}$ of the first and the second complementary half-bridge sensor circuit having the same second predefined reference magnetization direction may be formed in the second common area (in the same layer level as the first common area or in the second layer level), for example.

Furthermore, the magnetoresistive structures of the first complementary half-bridge sensor circuit 101a and the second half-bridge sensor circuit 101b having the same second predefined reference magnetization direction may be formed adjacently to each other, and the magnetoresistive structures of the first complementary half-bridge sensor circuit 101a and the second complementary half-bridge sensor circuit 101b having the same second predefined reference magnetization direction may be formed adjacently to each other in the second common area.

The half-bridge sensor circuits of the third and fourth full-bridge sensor circuits may also be arranged according to similar principles as the first and second full-bridge sensor circuits, for example.

FIG. 4 further shows a schematic arrangement and circuitry of the single resistors (or magnetoresistive structures) for an optimum positioning for an efficient laser magnetization process. The (or all) resistors (or magnetoresistive structures) with identical reference magnetization direction are close together or next to each other, thereby enabling a magnetization at the same time (e.g. using a fast laser magnetization process). Vertical stacking may remove unwanted effects from different field conditions for the at least two sensor bridges but the laser magnetization process may take twice as long, for example.

In other examples, the redundant half-bridge circuits may have a reference direction offset with respect to the default half-bridge circuit it may replace in case of a fault. For example, an angle sensor with two full-bridges may be provided. Each full-bridge may be combined with half-bridges of the type V sin P and V sin N (sin-bridge) and V cos P and V cos N (cos-bridge), respectively. Furthermore, full-bridge signals e.g. with V sin P and V cos P (sin 45°-bridge) and V sin P and V cos N (cos 45°-bridge) may be generated (for example by redundant half-bridge circuits). The sin 45° signal may be a signal phase shifted by 45° regarding the sine bridge and the cos 45° signal may be a signal phase shifted by 45° regarding the cosine signal, respectively. The bridge output signal may be a factor of $\sqrt{2}/2=0.707$ smaller compared to the sin-bridge and cos-bridge signal. The angle error remains the same regarding phase and height.

In other examples, further checks may be applied. For example, the signals of V sin P/V cos P-bridge and V sin N/V cos N-bridge may be used to validate the functionality of the corresponding half-bridges. Generally speaking, by different half-bridge combinations, the functionality of the main (or default) half-bridges may be evaluated.

The sensor circuits described herein may enhance the availability of an xMR (AMR, GMR, and TMR) sensor by adding at least one further sensor structure (e.g. four different half-bridge types). Identical half-bridges may be placed next to each other. Thereby, a real redundancy is provided and the process time for the magnetization process as well as active area size may be reduced. Moreover, resistors with identical reference magnetization may be placed next to each other, as well. Furthermore, a check/validation of all half-bridge by a connection of orthogonal half-bridge types to full-bridges may be carried out. The sensor signals from orthogonal half-bridge types may be suitable to provide sufficient information for a reliable angle calculation even if both structures of one half-bridge type within two full-bridge arrangements fail.

More details and aspects are mentioned in connection with the embodiments described above or below (e.g. the half-bridge sensor circuits, the full-bridge sensor circuits the sensor output value determination circuit, the magnetoresistive structures, the error determination circuit, the control circuit, the sensor output value determination circuit, the arrangement of the magnetoresistive structures, the common areas of the semiconductor substrate and the layer levels of the semiconductor substrate). The embodiments shown in FIG. 4 may comprise one or more optional additional features corresponding to one or more aspects mentioned in connection with the proposed concept or one or more embodiments described above (e.g. FIGS. 1 to 3) or below (e.g. FIGS. 5 to 7).

Figure 5:
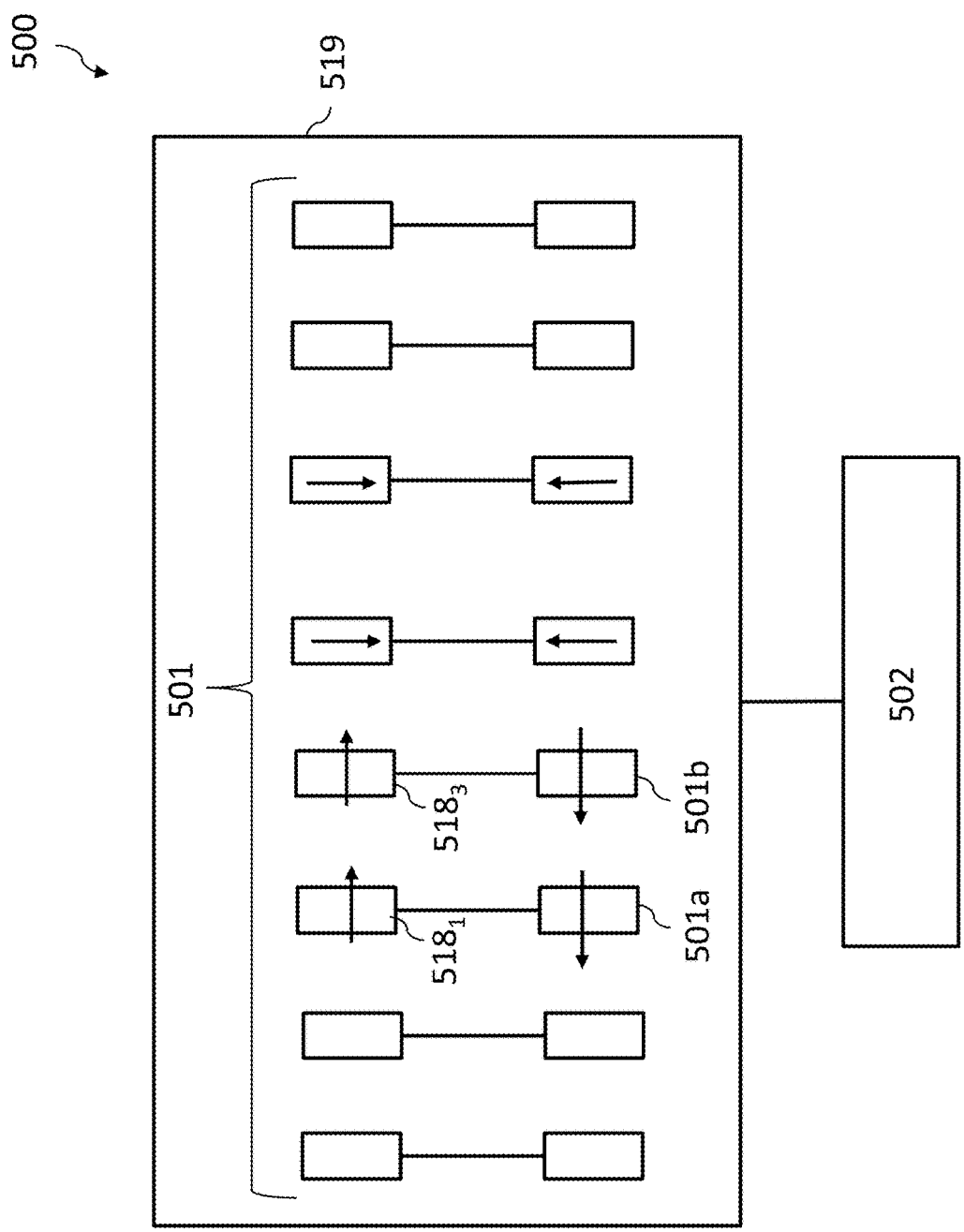
FIG. 5 shows a schematic illustration of a sensor device.

FIG. 5 shows a schematic illustration of a sensor device 500 according to an embodiment.

The sensor device 500 includes a plurality of half-bridge sensor circuits 501, each including a pair of magnetoresistive structures. The sensor device includes a sensor output value determination circuit 502 configured to determine a sensor output value based on at least four half-bridge sensor signals provided by four of the half-bridge sensor circuits of the plurality of half-bridge sensor circuits. A first half-bridge sensor circuit 501a and a second half-bridge sensor circuit 501b of the plurality of half-bridge sensor circuits are formed on a common semiconductor substrate 519. A magnetoresistive structure $518_1$ of the first half-bridge sensor circuit having a same predefined reference magnetization direction as a magnetoresistive structure $518_3$ of the second half-bridge sensor circuit are formed adjacently on the common semiconductor substrate 519.

As magnetoresistive structures of the first half-bridge sensor circuit having a same predefined reference magnetization direction as a magnetoresistive structure of the second half-bridge sensor circuit are formed adjacently on the common semiconductor substrate, a redundancy may be obtained. The redundancy may be obtained due to a redundant half-bridge sensor circuit may be exposed to substantially similar magnetic field as the default half-bridge sensor circuit, for example. Therefore, errors or differences caused by different field conditions between the original (e.g. default) half-bridge sensor circuit and its replacement (e.g. redundant) half-bridge sensor circuit may be reduced or eliminated, for example. Furthermore, process times for the magnetization process and active area size of the half-bridge sensor circuits may be reduced.

The sensor circuit 500 may further include an error determination circuit 104 and a control circuit 106. In some examples, the error determination circuit 104, the control circuit 106, and the sensor output value determination circuit 502 may be formed on different semiconductor substrates. In some examples, the error determination circuit 104, the control circuit 106 and the sensor output value determination circuit 102 may be formed on the same semiconductor substrate. For example, they may be formed on the same common semiconductor substrate as one or more half-bridge sensor circuits.

More details and aspects are mentioned in connection with the embodiments described above or below (e.g. the half-bridge sensor circuits, the full-bridge sensor circuits, the sensor output value determination circuit, the error determination circuit, the control circuit, the sensor output value determination circuit, the arrangement of the magnetoresistive structures, the common areas of the semiconductor substrate and the layer levels of the semiconductor substrate). The embodiments shown in FIG. 5 may comprise one or more optional additional features corresponding to one or more aspects mentioned in connection with the proposed concept or one or more embodiments described above (e.g. FIGS. 1 to 4) or below (e.g. FIGS. 6 to 7).

Figure 6:
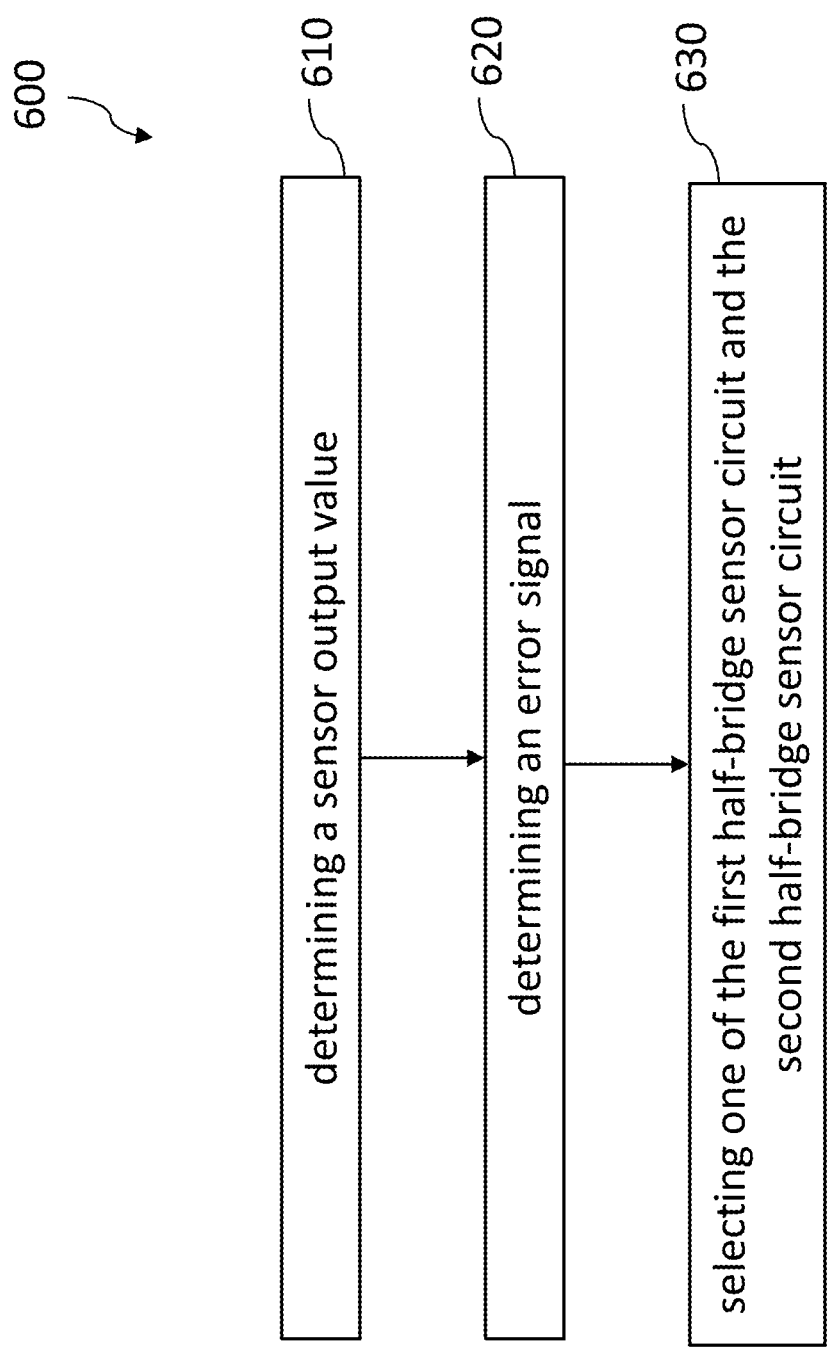
FIG. 6 shows a flow chart of a method for providing a sensor output value.

FIG. 6 shows a flow chart of a method 600 for providing a sensor output value according to an embodiment.

The method 600 may include determining 610 a sensor output value based on at least one half-bridge sensor signal provided by a half-bridge sensor circuit of a plurality of half-bridge sensor circuits.

The method 600 may further include determining 620 an error signal based on a first half-bridge sensor signal generated by a first half-bridge sensor circuit of the plurality of half-bridge sensor circuits and a second half-bridge sensor signal generated by a second half-bridge sensor circuit of the plurality of half-bridge sensor circuits.

The method 600 may further include selecting 630 based on the error signal one of the first half-bridge sensor circuit and the second half-bridge sensor circuit. It may be of interest to use the selected half-bridge circuit for providing one of the first half-bridge sensor signal and the second half-bridge sensor signal to the sensor output value determination circuit. The provided half-bridge sensor signal may further be used to determine the sensor output value.

The method allows a faulty half-bridge sensor circuit to be identified. Once the faulty half-bridge sensor circuit is identified, it may be replaced by a working half-bridge sensor circuit. Replacing the half-bridge sensor circuit may be beneficial over replacing a full-bridge sensor circuit. This is of particular interest, should only one half-bridge circuit out of the full-bridge sensor circuit be faulty. This may lead to reduced costs, for example.

The method 600 may further include determining the error signal based on a comparison, an addition or a subtraction of the first half-bridge sensor signal and the second half-bridge sensor signal, but is not limited thereto.

The method 600 may further include determining the error signal based on a comparison, an addition or a subtraction of the at least one half-bridge sensor signal generated by the plurality of half-bridge sensor circuits and at least one of the first half-bridge sensor signal and the second half-bridge sensor signal. In a non-limiting example, the method may include determining the error signal based on a sampling of signal values of the at least one half-bridge sensor signal and a sampling of signal values of at least one of the first half-bridge sensor signal and the second half-bridge sensor signal. In a non-limiting example, sampled values of the at least one half-bridge sensor signal may be compared with sampled values of the first half-bridge sensor signal and/or the second half-bridge sensor signal. In a further non-limiting example, a deviation may be determined based on a subtraction or addition of sampled signal values of at least one half-bridge sensor signal from the first half-bridge sensor signal and/or the second half-bridge sensor signal). As described with respect to earlier figures, the method may include determining the error signal if an amplitude and/or phase one of the first half-bridge sensor signal and the second half-bridge sensor signal deviates from each other by more than a threshold value e.g. by more than 1% or e.g. more than 5% or e.g. more than 10%. In a further non-limiting example, the deviation may be compared against a threshold value or values and an error signal may be determined or generated based on the comparison.

More details and aspects are mentioned in connection with the embodiments described above or below (e.g. the half-bridge sensor circuits, the sensor output value determination circuit, the error determination circuit, the control circuit and the sensor output value determination circuit, determining the sensor output value, providing the half-bridge sensor signals by the half-bridge sensor circuit, determining the error signal, selecting the half-bridge sensor circuits and providing the half-bridge sensor signals to the sensor output value determination circuit). The embodiments shown in FIG. 6 may comprise one or more optional additional features corresponding to one or more aspects mentioned in connection with the proposed concept or one or more embodiments described above (e.g. FIGS. 1 to 5) or below (e.g. FIG. 7).

Figure 7:
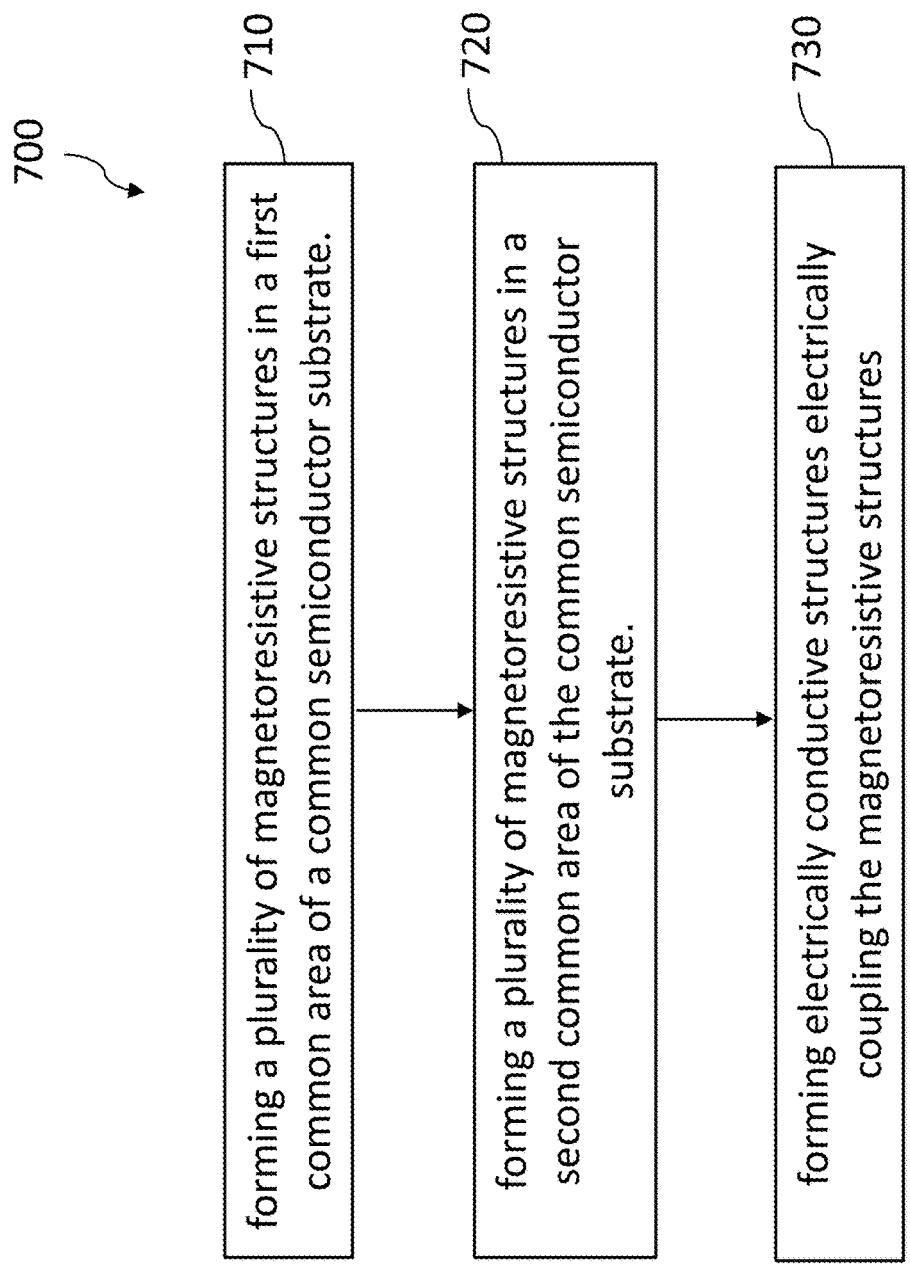
FIG. 7 shows a flow chart of a method for forming a sensor circuit.

FIG. 7 shows a flow chart of a method 700 for forming a sensor circuit according to an embodiment.

The method 700 includes forming 710 a plurality of magnetoresistive structures having a first predefined reference magnetization direction in a first common area of a common semiconductor substrate.

The method 700 may further include forming 720 a plurality of magnetoresistive structures having a second predefined reference magnetization direction in a second common area of the common semiconductor substrate.

The method 700 may further include forming 730 electrically conductive structures electrically coupling the magnetoresistive structures having the first predefined reference magnetization direction to the magnetoresistive structures having the second predefined reference magnetization direction to form a plurality of half-bridge sensor circuits. Each half-bridge sensor circuit includes a magnetoresistive structure having the first predefined reference magnetization direction electrically coupled to a second magnetoresistive structure having the second predefined reference magnetization direction.

As magnetoresistive structures having the same predefined reference magnetization directions are formed in the same common area, process times for the magnetization process and active area size of the half-bridge sensor circuits may be reduced. Furthermore, this may result in reduced costs.

The method 700 may further include forming electrically conductive structures. The electrically conductive structures may electrically couple the first magnetoresistive structure having a first predefined reference magnetization direction to a second magnetoresistive structure having a second predefined reference magnetization direction, thus forming a first half-bridge sensor circuit.

Furthermore, a forming of a second half-bridge sensor circuit may be performed. The second half-bridge sensor circuit may be formed by providing electrically conductive structures electrically coupling a further first magnetoresistive structure having a first predefined reference magnetization direction to a further second magnetoresistive structure having the second predefined reference magnetization direction. The second half-bridge sensor circuit may be formed adjacent to the first half-bridge sensor circuit. The further first magnetoresistive structure may be formed adjacent to the first magnetoresistive structure and the further second magnetoresistive structure may be adjacent to the second magnetoresistive structure but is not limited thereto.

At least part of the process for forming the plurality of magnetoresistive structures having the first predefined reference magnetization direction and the second predefined reference magnetization direction may be carried out simultaneously. For example, the magnetoresistive structures having the same first predefined reference magnetization direction may be formed adjacently to each other in the first common area. Further, the magnetoresistive structures having the same second predefined reference magnetization direction may be formed adjacently to each other in the second common area. The formation or deposition (e.g. by evaporation, sputter or chemical vapor deposition) of the exchange layer, the pinned layer, the non-magnetic spacer layer, and the sensing layer may be carried out simultaneously for both structures, especially if they are in the same layer level. Similarly, the formation or deposition of structures (e.g. electrically conductive structures) may be carried out simultaneously, as the structured formed or deposited are similar to the magnetoresistive structures having the first and the second predefined reference magnetization directions, respectively.

Forming the plurality of magnetoresistive structures having the first predefined reference magnetization direction may include laser treatment (e.g. using a fast laser magnetization process) of the first common area during a first time interval, for example. Forming the plurality of adjacent magnetoresistive structures having the second predefined reference magnetization direction may include laser treatment of the second common area during a subsequent second time interval. The first time interval may be different from the second time interval, for example.

The method 700 may further include forming electrically conductive structures electrically coupling the sensor output value determination circuit, the error determination circuit, the control circuit, and the sensor output value determination circuit to the plurality of half-bridge sensor circuits. The sensor output value determination circuit, the error determination circuit, the control circuit, and the sensor output value determination circuit may be formed on the same or different semiconductor substrate or may be implemented by a computer program, for example.

More details and aspects are mentioned in connection with the embodiments described above or below (e.g. the half-bridge sensor circuits, the sensor output value determination circuit, the error determination circuit, the control circuit and the sensor output value determination circuit, forming the adjacent magnetoresistive structures, the first and second common areas, and the electrically conductive structures). The embodiments shown in FIG. 7 may comprise one or more optional additional features corresponding to one or more aspects mentioned in connection with the proposed concept or one or more embodiments described above (e.g. FIGS. 1 to 6).

Various embodiments relate to improving system availability by a multiple bridge structure. Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a sensor circuit, the method comprising:
    forming a plurality of magnetoresistive structures having a first predefined reference magnetization direction in a first common area of a common semiconductor substrate, wherein the forming the plurality of magnetoresistive structures having the first predefined reference magnetization direction comprises laser treatment of the first common area during a first time interval;
    forming a plurality of magnetoresistive structures having a second predefined reference magnetization direction in a second common area of the common semiconductor substrate, wherein the forming the plurality of magnetoresistive structures having the second predefined reference magnetization direction comprises laser treatment of the second common area during a subsequent second time interval; and
    forming electrically conductive structures electrically coupling the magnetoresistive structures having the first predefined reference magnetization direction to the magnetoresistive structures having the second predefined reference magnetization direction to form a plurality of half-bridge sensor circuits, wherein each half-bridge sensor circuit comprises a magnetoresistive structure having the first predefined reference magnetization direction electrically coupled to a second magnetoresistive structure having the second predefined reference magnetization direction.

2. The method according to claim 1, wherein the laser treatment is a fast laser magnetization process.

3. The method according to claim 1, wherein the first time interval is different from the second time interval.

4. The method according to claim 1, wherein at least two of the plurality of half-bridge sensor circuits are formed adjacent to one another.

5. The method according to claim 1, wherein at least part of the forming the plurality of magnetoresistive structures having the first predefined reference magnetization direction, and the forming the plurality of magnetoresistive structures having the second predefined reference magnetization direction, are carried out simultaneously.

6. The method according to claim 1, wherein the forming the plurality of magnetoresistive structures having the first and second predefined reference magnetization directions comprise forming exchange layers, pinned layers, non-magnetic spacer layers, and sensing layers simultaneously for both magnetoresistive structures having the first and second predefined reference magnetization directions.

7. The method of claim 6, wherein the forming exchange layers, the pinned layers, the non-magnetic spacer layers, and the sensing layers are carried out by evaporation, sputter, or chemical vapor deposition.

8. The method according to claim 1, wherein the electrically conductive structures are formed simultaneously.

9. The method according to claim 1, wherein the forming the plurality of magnetoresistive structures having the first predefined reference magnetization direction comprises forming the plurality of magnetoresistive structures having the first predefined reference magnetization direction adjacent to each other.

10. The method according to claim 9, wherein the forming the plurality of magnetoresistive structures having the second predefined reference magnetization direction comprises forming the plurality of magnetoresistive structures having the second predefined reference magnetization direction adjacent to each other.

11. The method according to claim 1, wherein the forming the electrically conductive structures comprises electrically coupling the plurality of half-bridge sensor circuits to a sensor output value determination circuit, an error determination circuit, and a control circuit.

12. The method according to claim 11, wherein the sensor output value determination circuit, the error determination circuit, and the control circuit are formed on the common semiconductor substrate.

13. The method according to claim 1, wherein the forming the electrically conductive structures comprises electrically coupling the plurality of half-bridge sensor circuits to a sensor output value determiner, an error determiner, and a controller, and the sensor output value determiner, the error determiner, and the controller are implemented by a computer program.

14. The method according to claim 11, wherein the sensor output value determination circuit, the error determination circuit, and the control circuit are formed on a different semiconductor substrate than the common semiconductor substrate.

15. The method according to claim 1, wherein no magnetoresistive structure having the second predefined reference magnetization direction is formed in the first common area, and/or no magnetoresistive structure having the first predefined reference magnetization direction is formed in the second common area.

16. The method according to claim 1, wherein at least one of the plurality of half-bridge sensor circuits is formed adjacent to an identical redundant half-bridge sensor circuit.

* * * * *